(12) United States Patent
Ueki et al.

(10) Patent No.: US 6,871,701 B2
(45) Date of Patent: Mar. 29, 2005

(54) PLATE-TYPE HEAT PIPE AND METHOD FOR MANUFACTURING THE SAME

(75) Inventors: Tatsuhiko Ueki, Tokyo (JP); Masaaki Yamamoto, Tokyo (JP); Yuichi Kimura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/109,598

(22) Filed: Mar. 26, 2002

(65) Prior Publication Data

US 2003/0173064 A1 Sep. 18, 2003

(30) Foreign Application Priority Data

| Apr. 9, 2001 | (JP) | ........................................ 2001-110300 |
| Oct. 1, 2001 | (JP) | ........................................ 2001-305064 |
| Dec. 26, 2001 | (JP) | ........................................ 2001-393816 |

(51) Int. Cl.[7] ............................................. F28D 15/00
(52) U.S. Cl. ............................... 165/104.26; 29/890.032
(58) Field of Search ...................... 165/81, 170, 104.21, 165/104.26, 104.33; 29/890.032, 890.039

(56) References Cited

U.S. PATENT DOCUMENTS

| 3,831,664 | A | * | 8/1974 | Pogson ........................ 165/80.5 |
| 5,642,776 | A | * | 7/1997 | Meyer et al. ........... 165/104.26 |
| 5,737,840 | A | * | 4/1998 | Akachi ................... 29/890.032 |
| 6,230,407 | B1 | * | 5/2001 | Akutsu .................. 29/890.032 |
| 6,269,866 | B1 | * | 8/2001 | Yamamoto et al. ..... 165/104.26 |
| 6,279,229 | B1 | * | 8/2001 | Lemke et al. ............. 29/890.03 |
| 6,397,935 | B1 | * | 6/2002 | Yamamoto et al. ..... 165/104.26 |
| 6,446,706 | B1 | * | 9/2002 | Rosenfeld et al. ............. 165/46 |
| 6,547,000 | B1 | * | 4/2003 | Rantala et al. ............... 165/170 |
| 2001/0022219 | A1 | * | 9/2001 | Ikeda et al. .................... 165/46 |

* cited by examiner

Primary Examiner—Terrell Mckinnon
(74) Attorney, Agent, or Firm—Oblon, Spivak, McClelland, Maier & Neustadt, P.C.

(57) ABSTRACT

A plate-type heat pipe including a hermetically sealed container in which a working fluid is received, said container comprising a plate member on which at least one heat generating device is thermally connected and another plate member forming a cavity inside thereof in combination with said plate member, and said container being formed by pressure-bonding both peripheral portions of said plate member and said another plate member combined together.

7 Claims, 11 Drawing Sheets

PLATE-TYPE HEAT PIPE AND METHOD FOR MANUFACTURING THE SAME

BACKGROUND OF THE INVENTION

1. Field of the Invention

The present invention relates to a plate-type heat pipe suitable for cooling an electric or electronic component, for example, a high heat generating device to be cooled such as a semiconductor chip or the like, and to a method for manufacturing the same.

2. Related Art

An electronic component such as a semiconductor device or the like including a CPU of a personal computer, a laser light emitting diode, a power transistor or the like being mounted on an electric or electronic machine is hard to avoid generation of heat to some extent caused by the use of it, and cooling of the generated heat is becoming a significant technical problem in recent years. As a method for cooling an electric or electronic device needing to be cooled (hereinafter, referred to as a "heat generating device"), there are typically known a method of lowering the air temperature inside the box of a machine by mounting a fan on the machine, a method of directly cooling a heat generating device by mounting a cooling body on the heat generating device, or the like.

As a cooling body to be mounted on a heat generating device, for example a plate material being excellent in heat transfer such as a copper material, an aluminum material or the like, or a plate-type heat pipe or the like are often used.

A plate-type heat pipe is a plate-shaped heat pipe, and may be further called a plane-type heat pipe or a flat-plate type heat pipe. Hereinafter, it is referred to as a plate-type heat pipe.

A heat pipe is briefly described. A heat pipe includes a container having a cavity and has a working fluid sealed in the cavity. The cavity is vacuum-exhausted to make the working fluid easy to evaporate. As a working fluid, water, alcohol, a flon substitute or the like is used in consideration of its adaptivity to a material for the container.

The operation of a heat pipe is briefly described. More specifically, at the heat absorbing side of a heat pipe, a working fluid is vaporized by the heat conducted through a material forming the container of the heat pipe and the vaporized working fluid moves to the heat dissipating side of the heat pipe. At the heat dissipating side, the vaporized working fluid is cooled and returned to a liquid phase.

Then, the working fluid which has come back to the liquid phase flows back to the heat absorbing side. The transfer of the heat is performed by such a phase transformation and movement of the working fluid.

The flowing back of the working fluid is made by gravity or capillary action. In case of the gravity-type heat pipe, the working fluid flows back by disposing the heat absorbing portion lower than the heat dissipating portion. In case of the capillary action-type heat pipe, the working fluid flows back due to a capillary phenomenon of grooves or of a wick by providing the grooves in the inner wall of the container or by inserting the wick comprising a metal mesh, a porous material or the like into the cavity.

Thus, a great amount of heat is transferred in the heat pipe by the phase transformation and movement of the working fluid received inside the hermetically sealed cavity of the heat pipe. Of course, although some amount of heat is transferred by heat conduction through the plate material forming the heat pipe, the amount thereof is relatively small.

To the above-mentioned heat absorbing side a heat generating component is thermally connected. And heat dissipating fins for example are attached to the heat dissipating side. Due to such construction of the heat pipe, a larger portion of the heat from the heat generating component is transferred by the heat pipe and is dissipated through the heat dissipating fins.

Now, the heat pipe has an advantage in which a heat generating component and the heat pipe are easily connected with each other thanks to the features in the shape of the heat pipe. The reason is that by bringing a heat generating component such as a semiconductor device or the like into contact with a main surface of the heat pipe, they can be made contact with each other in a wide area.

For thermal contact of a heat generating component with a heat pipe, a heat transfer grease or a heat transfer rubber may be placed between both of them, or they both may be joined to each other by soldering or the like. In addition, on the opposite face to the main face of the plate-type heat pipe to which the heat generating component is thermally connected, heat dissipating fins or a heat sink and further a fan or the like is preferably mounted. A cooling structure being excellent also in space efficiency can be realized by such an arrangement. In this case, when the main face of the heat pipe to which the heat generating component is thermally connected is deformed, the thermal resistance thereof becomes higher, thus it is necessary for the main face of the heat pipe to have no deformation.

Particularly in recent years, with the increase in integration density and speed of a CPU, the density of heat generation tends to be made higher and the function of the heat pipe must cope with not only requirement for transferring heat but also requirement for such heat diffusion as to diffuse a high-density thermal flux into a low-density thermal flux. And since a printed circuit board with a CPU mounted may be arranged in various positions, a heat pipe also must functions even in a state where it is arranged in various positions. Therefore, it is necessary to prevent occurrence of a so-called dry-out state (i.e., which is a state where the supply of a working fluid lags behind the evaporation thereof at the heat absorbing portion and accordingly the working fluid does not exist in the heat absorbing portion, and the heat transfer operation of the heat pipe cannot be continued). In order to solve the above-mentioned problem, a heat transfer block functioning to diffuse a high-density heat into a low-density heat is provided at the portion in the container to which high density heat generating component is thermally connected, or a wick of a metal mesh, a porous material or the like is properly arranged. A heat transfer block may be inserted as a separate component into the container or may be also formed into one body together with the container.

As a method of forming the container of the plate-type heat pipe, there have been proposed a method of joining two plate-shaped members formed by a press or the like by means of brazing or the like (Japanese Patent Application No.Hei 8-312,980 for example), a method of sealing and joining by folding (Japanese Patent Application No.Hei 10-099,781) or the like.

However, when brazing or soldering is used for joining members forming the hermetically sealed container, a problem occurs that the heat pipe is liable to be deteriorated in performance, depending upon the adaptivity of a brazing material to a working fluid or upon the kind of flux. In order to improve the adaptivity of a brazing material to a working fluid, it is desirable to use a brazing material having a composition approximate to the parent material, but in this case, since the melting point of the brazing material is necessarily made close to the melting point of the parent material, a problem occurs that the strength is lowered by annealing of the parent material. Furthermore, the increase in cost caused by a time required for processing or the use of other materials such as a brazing material or the like cannot be avoided.

On the other hand, in case of sealing by folding, there is a problem that the outer configuration of the plate material is restricted and only simple configurations are applicable. In addition, since this method makes difficult the metal bonding of the members with each other, it is not possible to keep the hermetical sealing for a long period of time. More specifically, there is a problem that a long-term reliability as the heat pipe is deteriorated. Therefore, it is difficult to manufacture a highly hermetically sealed container for the heat pipe by means of the above mentioned method per se.

SUMMARY OF THE INVENTION

One embodiment of a plate-type heat pipe including a hermetically sealed container in which a working fluid is received, said container comprising a plate member on which surface at least one heat generating device is thermally connected and another plate member forming a cavity inside thereof in combination with said plate member, and said container being formed by pressure-bonding both peripheral portions of said plate member and said another plate member combined together.

One embodiment of a method for manufacturing a plate-type heat pipe is a method comprising the steps of:

preparing a plate member to which at least one heat generating device is thermally connected and another plate member, said plate member and said another plate member respectively having a peripheral portion and a depressed portion of a prescribed height for forming a cavity inside thereof in combination with each other;

providing a deformation absorbing structure for absorbing a deformation in a direction along a joined interface between said plate member and said another plate member;

combining together said plate member and said another plate member so that said depressed portions are opposite to each other to form said cavity, and pressure-bonding combined peripheral portions and absorbing said deformation of the plate member and another plate member in a direction along said joined interface, to thereby form a container having no deformation on a main face; and receiving a working fluid inside thus formed container to manufacture a plate-type heat pipe.

BRIEF DESCRIPTION OF THE DRAWINGS

FIG. 11 is a schematic sectional view for explaining an embodiment of a method for manufacturing a plate-type heat pipe according to the present invention;

FIG. 12 is a schematic sectional view for explaining another embodiment of a method for manufacturing a plate-type heat pipe according to the present invention;

FIG. 13 is a schematic sectional view for explaining another embodiment of a method for manufacturing a plate-type heat pipe according to the present invention;

FIG. 14 is a schematic sectional view for explaining another embodiment of a method for manufacturing a plate-type heat pipe according to the present invention;

FIG. 15 is a schematic sectional view for explaining an embodiment of a method for manufacturing a plate-type heat pipe according to the present invention;

FIG. 16 is a schematic sectional view for explaining another embodiment of a method for manufacturing a plate-type heat pipe according to the present invention;

DETAILED DESCRIPTION OF THE PREFERRED EMBODIMENTS

The inventors have intensively studied in order to solve the above-mentioned problems. As a result, it has become clear that when pressing the peripheral portions of a plate member to which a heat generating device is thermally connected and another plate member forming a cavity inside thereof in combination with said plate member while keeping the plate members under clean condition, new surfaces are generated on the joined surfaces of both the plate member and the another plate member, and thus generated new surfaces are pressure-joined to be metal-bonded and thereby a heat pipe including a hermetically sealed container not deteriorated in strength can be manufactured. Furthermore, it has become clear that when there is provided a deformation absorbing structure for absorbing the deformation of plate members in a direction along the joined interface between a plate member and another plate member in at least one of the plate member and the another plate member, and when the plate member and the another plate member are combined together and the peripheral portions of the plate members are pressure-bonded, a container having a main surface without deformation can be formed, since the deformation of the plate members in a direction along the joined interface can be absorbed by said deformation absorbing structure.

An object of the present invention is to provide a heat pipe including a highly hermetically sealed container with a main surface not deformed and having a long-term reliability, without lowering the strength of plate members of the heat pipe and a method for manufacturing the same.

A plate-type heat pipe of the present invention is a plate-type heat pipe including a hermetically sealed container in which a working fluid is received, said container comprising a plate member on which surface at least one heat generating device is thermally connected and another plate member forming a cavity inside thereof in combination with said plate member, and said container being formed by pressure-bonding both peripheral portions of said plate member and said another plate member combined together. The above-mentioned joining is performed by metal bonding by means of pressing. More specifically, new surfaces are generated on the respective joined surfaces of the peripheral portions of the plate member and the another plate member, and the new surfaces are pressure-bonded with each other to be metal-bonded.

In the present invention, pressure-bonding includes cladding.

Figures 1A, 1B, 1C:
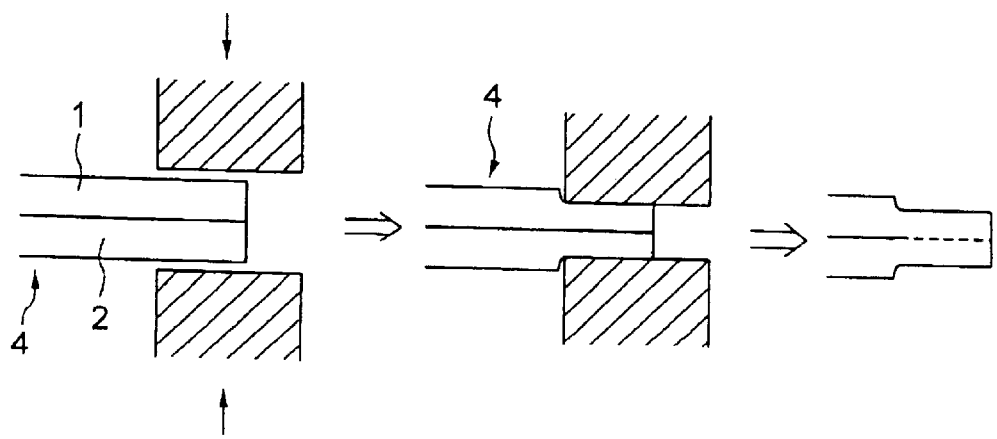
FIG. 1 is a schematic sectional view for explaining an example of pressure-bonding of the peripheral portion of a plate-type heat pipe according to the present invention.

FIG. 1 is a schematic sectional view for explaining an example of pressure-bonding of the peripheral portion of a plate-type heat pipe according to the present invention. As shown in FIG. 1A, the pressure-bonding in the present invention at first places one on another two plate members forming the main surfaces of a plate-type heat pipe, namely, the peripheral portions 4 of an upper plate member 1 and a lower plate member 2 are layered. Then, as shown in FIG. 1B, the peripheral portions 4 of the upper plate member 1 and the lower plate member 2 are pressed from both of the upper and lower sides, for example, in the vertical directions. The amount of the displacement by pressing varies according to materials of the upper plate member and the lower plate member, the state of their surfaces and the environment (a vacuum or the air) where the pressing is performed. For example, in case that the surfaces of both plate members are cleaned and are pressed in a vacuum, the amount of the displacement by pressing may be 2 to 3%, and in case of pressing in the air, it is required that the pressing provides the reduction of at least 30%, preferably 50% or more in thickness.

As shown in FIG. 1C, by pressing the plate members in which the surfaces to be joined are layered so as to be placed face to face, new surfaces (clean metal surfaces having no oxide film nor adsorbing film) are exposed on the deformed surfaces, and the new surfaces are pressure-bonded to each other to be metal-bonded, thus the two members are joined. The metal-bonded portion in this case is a portion shown by a dotted line in FIG. 1C. The metal-bonded members are metal-bonded so firmly that a force applied in a direction to rip off the two plate members from each other does not separate them into the original plate members but breaks the parent material at the bonded portion, and the container is excellently hermetically sealed. The temperature at the time of pressure-bonding may be a temperature lower than the melting point of the plate members, for example, may be the normal room temperature.

The pressure-bonding method may be a method for plastically deforming the joined portions, and may use various forming methods such as flat-pressing, forging, drawing, ironing or the like. A forming method is selected according to the external configuration or the internal structure of a heat pipe. A surface to be joined needs to be made as clean as possible to remove membranes or extraneous matter such as an oxide, hydroxide, organic matter or the like, and as a method for doing so, there are listed mechanical methods such as brushing, sanding or the like, and chemical methods such as dry etching or the like.

For a period from cleaning of the surface to finishing of the pressure-bonding, a portion to be joined must be prevented to the utmost from adhesion of dust, moisture and oil thereto or from formation of an oxide membrane. In case that it is left in the air for a short time, there is no problem, and therefore for example it is possible to brush the surfaces to be joined in the air and just thereafter combine and flat-press them together, and thereby pressure-bond the surfaces. In addition, it is possible also to clean the joined portions of the members by means of plasma inside a vacuum chamber and pressure-bond them inside the chamber as keeping them in a vacuum or an inert atmosphere, and in this case the amount of displacement by pressing may be small.

Figure 2:
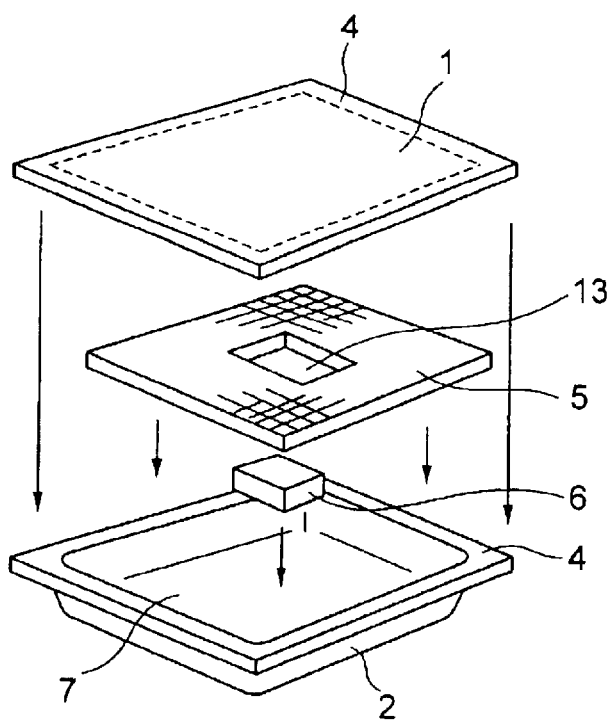
FIG. 2 is a schematic view for explaining an embodiment of a plate-type heat pipe according to the present invention.

FIG. 2 is a schematic view for explaining an embodiment of a plate-type heat pipe of the present invention. A plate-type heat pipe comprises a container composed of a plate member 2 having a surface press-formed into the shape of a box on which surface at least one heat generating device is thermally connected, and a flat plate member 1 forming a cavity 7 inside thereof in combination with the plate member 2, and has a heat transfer block 6 and a wick 5 disposed in the cavity.

The peripheral portions 4 of the combined plate member 2 and the plate member 1 with the heat transfer block 6 and the wick 5 disposed in the cavity are pressed and thereby new surfaces are generated on the respective joined surfaces of the peripheral portions 4 of the plate member 2 and the flat plate member 1, thus the newly generated surfaces are pressure-bonded so as to be metal-bonded.

At this time, a hermetically sealed container (hermetically sealed body) can be formed by pressure-bonding only the peripheral portions by means of such a mold as pressing only the peripheral portions without pressing the hollow portion of the container. More specifically, the portion metal-bonded in this case is a portion shown by a dotted line in FIG. 1C.

The metal-bonded members are metal-bonded so firmly that a force applied in a direction to rip off the two plate members from each other does not separate them into the original plate members but breaks the parent material at the bonded portion, and the container is excellent in hermetical sealing. Although not illustrated in the figure, a plate-shaped heat pipe can be made by providing an opening for liquid injection and degassing in some portion of a container, and injecting a working fluid (in case that the container is made of copper, for example, pure water) into and degassing the container.

Figure 3:
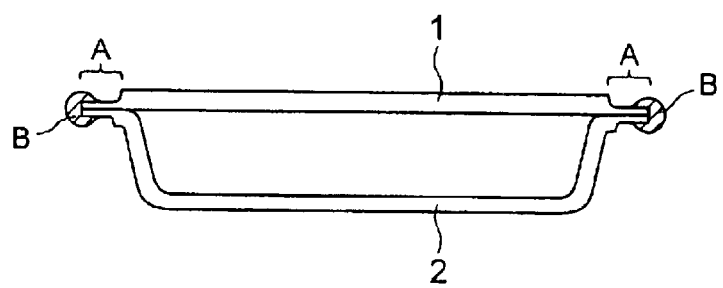
FIG. 3 is a schematic sectional view for explaining another embodiment of a plate-type heat pipe according to the present invention.

FIG. 3 is a schematic sectional view for explaining another embodiment of a plate-type heat pipe of the present invention. In this embodiment, as shown in FIG. 3, brazing or soldering is further applied to the pressure-bonded peripheral portions as shown in FIG. 1. Reinforcing the pressure-bonded peripheral portion by brazing or soldering brings an effect of improving the mechanical strength and/or preventing corrosion of the joined interface. Since the peripheral portion is locally deformed by pressure-bonding, there is the possibility that the portion made thinner in thickness is lowered in mechanical strength. The breakage of a hermetically sealed container caused by the reduction in mechanical strength brings an outflow of the working fluid of the heat pipe or an inflow of the air into the container, leading to a long-term degradation in performance of the heat pipe. On the other hand, the entry of solder into a heat pipe generates a gas inside the container as a result of reaction of a working fluid (pure water, for example) to a soldering material, leading to a long-term degradation in performance of the heat pipe.

In a plate-type heat pipe of the present invention, since the peripheral portions are hermetically sealed by pressure-bonding, even when the pressure-bonded portion of the peripheral portions is reinforced by brazing or soldering from the outside, no brazing filler metal nor solder enters the inside of the heat pipe and comes into contact with the working fluid. FIG. 3 shows the pressure-bonded portion of the peripheral portion by A and the soldered portion by B. As a brazing or soldering method, methods using a vacuum furnace, an atmospheric furnace, a torch, a soldering iron or the like are possible.

These methods are selected considering the material, shape and size of the container of a heat pipe, the heat performance required for a heat pipe, and the like.

Figure 4:
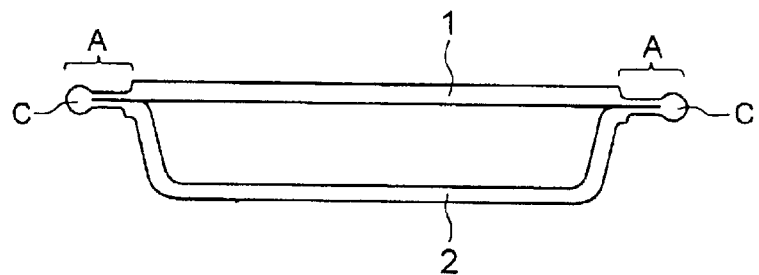
FIG. 4 is a schematic sectional view for explaining another embodiment of a plate-type heat pipe according to the present invention.

FIG. 4 is a schematic sectional view for explaining another embodiment of a plate-type heat pipe of the present invention. In this embodiment, as shown in FIG. 4, welding is further applied to the peripheral portions which are pressure-bonded in such manner as shown in FIG. 1.

In case that a sufficient mechanical strength such as pressure resistance or the like is obtained by the pressure-bonding but there is the possibility of slight leakage due to an incomplete hermetical sealing, welding may be used jointly with the pressure-bonding. Also in this case, a large portion of the joining strength is obtained by the pressure-bonding. In FIG. 4, the pressure-bonded portion is shown by A and the welded portion is shown by C. As the welding method, a welding method such as TIG welding, plasma welding, laser welding, electron beam welding or the like can be used. These methods are properly selected considering the material, shape and size of the container of a heat pipe, the heat performance required for a heat pipe, or the like.

Figure 5:
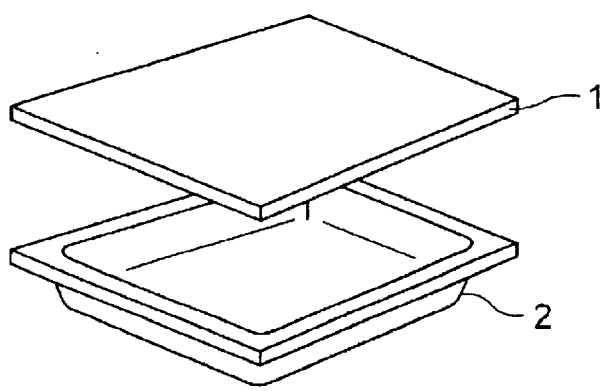
FIG. 5 is a schematic view for explaining another embodiment of a plate-type heat pipe according to the present invention.

FIG. 5 is a schematic view for explaining another embodiment of a plate-type heat pipe of the present invention. In a plate-type heat pipe of this embodiment, as shown in FIG. 5, the main portion forming a hermetically sealed body comprises two plate members 1 and 2 forming both the upper and lower main faces of the plate-type heat pipe. In this case, since a space (cavity) is formed inside as shown in FIG. 5, at least one plate member (2 in the figure) needs to be formed so as to have a prescribed height. The construction of this embodiment is the smallest in number of components and is easy to be formed.

Figure 6A:
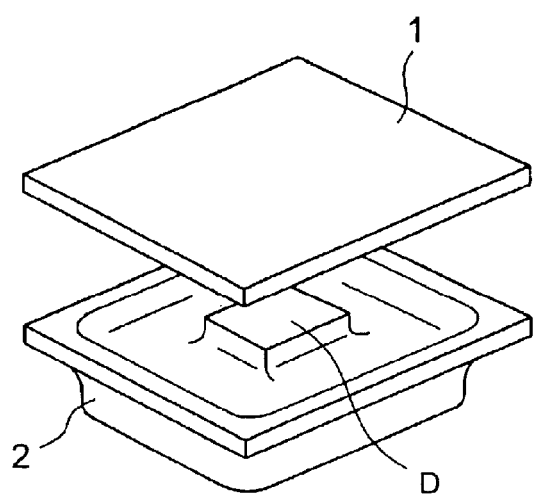
FIG. 6 is a schematic view for explaining another embodiment of a plate-type heat pipe according to the present invention.
Figure 6B:
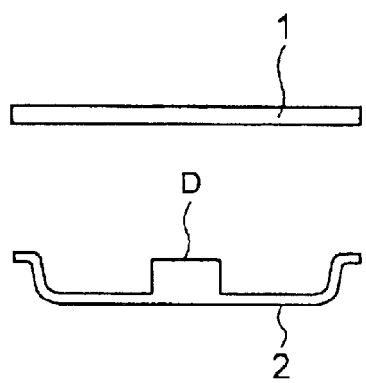

FIG. 6 is a schematic view for explaining another embodiment of a plate-type heat pipe of the present invention. In a plate-type heat pipe of this embodiment, a heat transfer block is disposed inside the container. As shown in FIG. 6, a block-shaped portion D can be formed in one body with one plate member 2 by forging. As a result, this embodiment has an advantage of making smaller the number of component members and more improving the heat conductivity in comparison with inserting a heat transfer block which is a separate component member.

As another embodiment of a plate-type heat pipe of the present invention, there is a plate-type heat pipe including a container being excellent in hermetical sealing, said container comprising a plate member as one main face to which at least one heat generating device is thermally connected, another plate member as another main face and a frame-shaped member as a side face forming a cavity therein by being placed between the one plate member and the another plate member, being formed by pressure-bonding the peripheral portions of the one plate member and the another plate member with the frame-shaped member placed therebetween, and having a working fluid received therein.

The above-mentioned pressure-bonding of the peripheral portions of one plate member and another plate member with a frame-shaped member placed therebetween is performed by metal bonding by means of pressing. More specifically, new surfaces are generated respectively on the joined surfaces of the peripheral portions of one plate member and another plate member as well as on the joined surfaces of the frame-shaped member, and thus generated new surfaces are pressure-bonded so as to be metal-bonded.

Figure 7A:
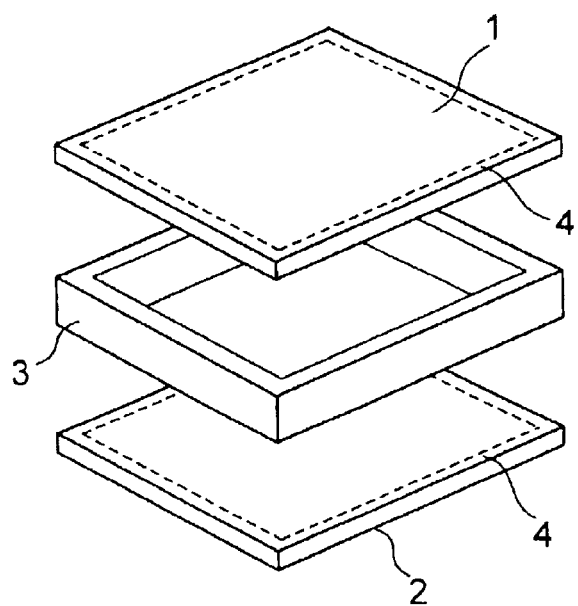
FIG. 7 is a schematic view for explaining members forming a plate-type heat pipe according to the present invention.
Figure 7B:
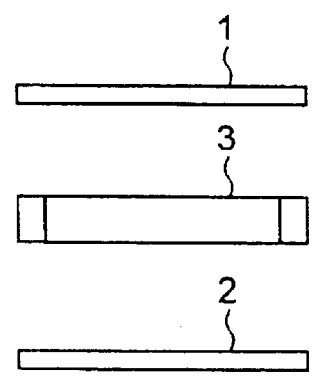

FIG. 7 is a schematic view for explaining members to form a plate-type heat pipe according to the present invention. As shown in FIG. 7, in this embodiment, main component members to form a container (hermetically sealed body) comprise two plate members 1 and 2 to form both the upper and lower main faces of a plate-type heat pipe and a frame-shaped member 3 as a side face to form a cavity inside thereof by being placed between the two plate members.

Figures 8A, 8B, 8C:
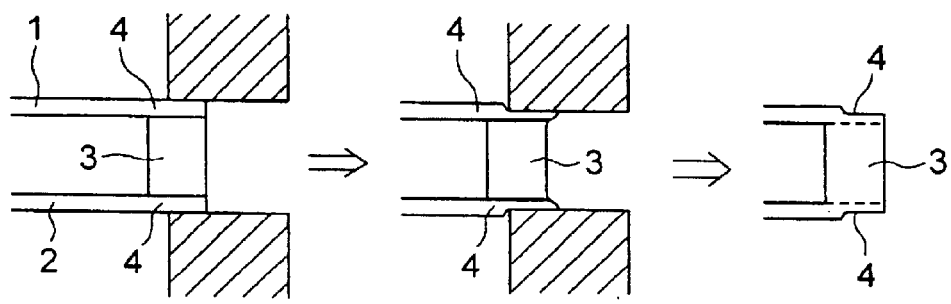
FIG. 8 is a schematic sectional view for explaining another example of pressure-bonding of the peripheral portion of a plate-type heat pipe according to the present invention.

FIG. 8 is a schematic sectional view for explaining another example of pressure-bonding of the peripheral portion of a plate-type heat pipe according to the present invention. As shown in FIG. 8A, the pressure-bonding in this invention at first places a frame-shaped member 3 as a side face between two plate members, namely, the upper plate member 1 and the lower plate member 2 so as to form the main faces of a plate-type heat pipe, and the frame-shaped member 3 and the peripheral portions 4 of the upper plate member 1 and the lower plate member 2 are layered in place. Then, as shown in FIG. 8B, the peripheral portion 4 of the upper plate member 1, the frame-shaped member 3 and the peripheral portion 4 of the lower plate member 2 thus layered in place are pressed vertically as shown by hatching.

The amount of displacement by pressing varies according to the materials of the upper plate member and the lower plate member, the state of the surfaces and the environment of pressing (in a vacuum or the air). For example, in case that the surfaces of both plate members are cleaned and then pressed in a vacuum, the amount of displacement by pressing may be 2 to 3%, and in case of pressing in the air, the pressing of such a degree that the pressing provides the reduction of at least 30%, preferably 50% or more in thickness is required.

As shown in FIG. 8C, by placing one on another and vertically pressing the surfaces to be joined of the upper plate member 1, the frame-shaped member 3 and the lower plate member 2, new surfaces (clean metal surfaces having no oxide film nor adsorbing film) are respectively exposed on the deformed surfaces, and the new surfaces are pressure-bonded to be metal-bonded to each other, thus the upper plate member, the frame-shaped member and the lower plate member are joined together. The portions metal-bonded in this case are shown by dotted lines between the upper plate member and the frame-shaped member as well as between the frame-shaped member and the lower plate member as shown in FIG. 8C. These component members are metal-bonded so firmly that a force applied in a direction to rip off these plate members does not separate them into the original plate members but breaks the parent materials at the bonded portion, and the container is excellent in hermetical sealing. The temperature at the time of pressure-bonding and a method for pressure-bonding are the same as described in the embodiment of FIG. 1.

In case of this embodiment, as shown in FIG. 8, the three component members of the upper plate member, the frame-shaped member and the lower plate member are pressure-bonded at the same time. The construction of the above-mentioned component members may be appropriately selected according to the shape, heat performance, cost or the like required.

Figure 9:
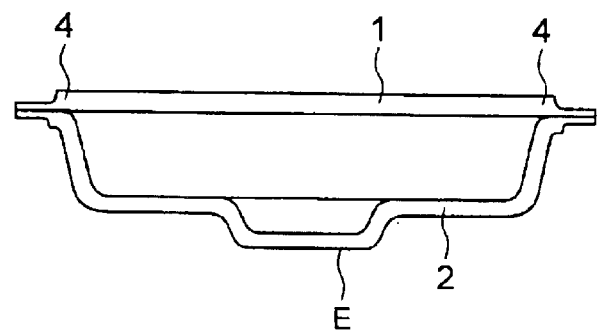
FIG. 9 is a schematic sectional view for explaining another embodiment of a plate-type heat pipe according to the present invention.

FIG. 9 is a schematic sectional view for explaining another embodiment of a plate-type heat pipe of the invention. In a plate-type heat pipe of this embodiment, as shown in FIG. 9, a convex portion E for efficiently cooling a heat generating device is formed in one plate member to which the heat generating device is thermally connected.

The shape of the convex portion may be determined according to the arrangement or the like of a heat generating device and other components to be mounted on a printed circuit board.

Figure 10:
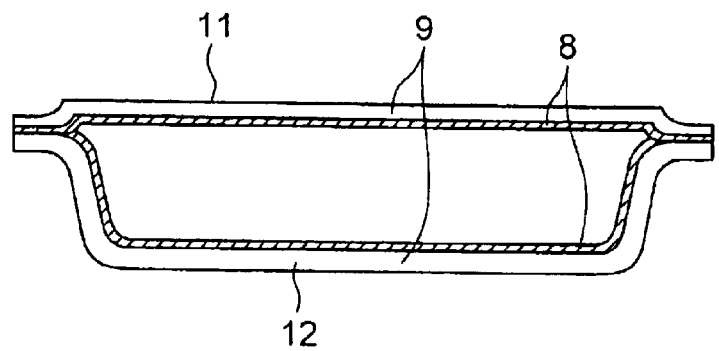
FIG. 10 is a schematic sectional view for explaining another embodiment of a plate-type heat pipe according to the present invention.

FIG. 10 is a schematic sectional view for explaining another embodiment of a plate-type heat pipe of the present invention. Usually a container is formed out of a material of only one kind such as only copper or only aluminum, but the embodiment shown in FIG. 10 uses clad materials 11 and 12 for plate members. In case of using clad materials, it is possible to use a material being high in adaptivity to a working fluid, for example, copper as a material 8 for forming the inner layer of a container of the clad materials 11 and 12 and use a material of high strength, low cost, light weight or the like, for example, aluminum according to requirements for mechanical strength and appearance as a material 9 for forming the outer layer, thus it is possible to extend freedom of mechanical design choice and reduce the cost.

Further, a mounting method of the present invention is a method for mounting a heat pipe, wherein a printed circuit board having a heat generating device mounted thereon is joined to a main surface of the above-mentioned plate-type heat pipe, and a heat sink is joined to the other main surface, in addition, a fan for blowing the heat sink is provided at a prescribed position.

A method for manufacturing a plate-type heat pipe of the present invention is a method for manufacturing a plate-type heat pipe being excellent in hermetical sealing, said method comprising a step of: preparing a plate member to which at least one heat generating device is thermally connected and another plate member forming a cavity inside thereof in combination with said plate member; providing in at least one plate member of said plate member and said another plate member a deformation absorbing structure for absorbing a deformation in a direction along a joined interface between said plate member and said another plate member; combining together said plate member and said another plate member, and pressure-bonding peripheral portions thereof and absorbing a deformation in a direction along said joined interface by means of said deformation absorbing structure, to thereby form a container having no deformation on a main face; and receiving a working fluid inside thus formed container to manufacture a hermetically sealed plate-type heat pipe.

The above-mentioned joining is performed by metal bonding by means of pressing. More specifically, new surfaces are formed on the respective joined surfaces of the peripheral portions of the plate member and the another plate member, and the new surfaces are pressure-bonded to be metal-bonded to each other.

In the pressure-bonding described in FIG. 1, a force is applied in a direction along the joined interface between the peripheral portions of the upper plate member 1 and the lower plate member 2 (namely, in the left or right direction along the horizontal direction in FIG. 1). When a force along the joined interface exceeds a specific value, there is the possibility that the upper plate member or the lower plate member is deformed (by a force applied in the left direction along the horizontal direction in FIG. 1). A method for manufacturing a plate-type heat pipe of the present invention is provided with a deformation absorbing structure and the deformation absorbing structure absorbs the deformation to be made in the upper plate member or the lower plate member by pressure-bonding. The invention is described more in detail hereunder.

Figure 11A:
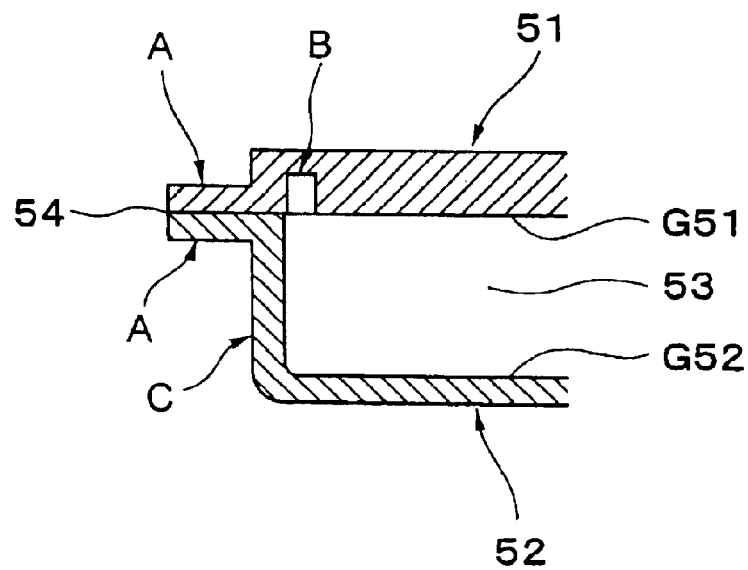
FIG. 11A is a schematic sectional view for explaining the combined plate members before pressure-bonded.
Figure 11B:
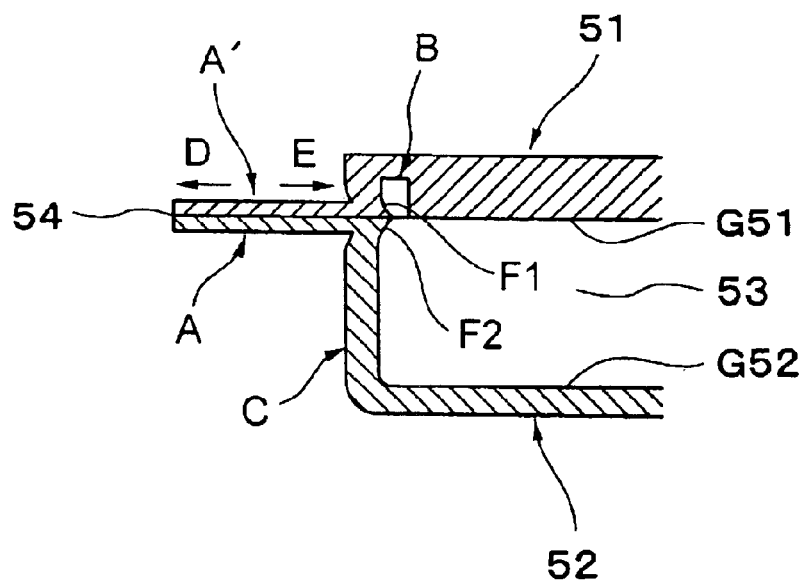
FIG. 11B is a schematic sectional view for explaining the state of the plate members after pressure-bonded.

FIG. 11 is a schematic sectional view for explaining an embodiment of a method for manufacturing a plate-type heat pipe of the present invention. FIG. 11A is a schematic sectional view for explaining the state of combining plate members before they are pressure-bonded. FIG. 11B is a schematic sectional view for explaining the state of the container after pressure-bonded.

In this embodiment of the method for manufacturing a plate-shaped heat pipe being excellent in hermetical sealing the method comprises the steps of: preparing a plate member to which at least one heat generating device is thermally connected and comprising a peripheral portion and a depressed portion of a prescribed height for forming a cavity, and another plate member forming the cavity inside thereof in combination with the plate member, said plate members being different in thickness from each other; providing an enclosing groove portion in a face for forming the cavity of the another plate member being larger in thickness; combining together the plate member and the another plate member to pressure-bond the peripheral portions thereof, so as to absorb the deformation of the plate members in a direction along the joined interface by means of a deformation absorbing structure composed of the enclosing groove portion and the depressed portion, thereby forming a container provided with a main surface having no deformation; and receiving a working fluid inside the container formed in such a manner.

More specifically, an upper plate member 51 forming the container of a heat pipe is almost flat, and a lower plate member 52 is press-formed so as to form a cavity. An enclosing groove portion B is provided in a face of the upper plate member 51 which is larger in thickness, the face of which forms a cavity 53, and the thickness of the peripheral portion A is made smaller than the thickness of the main body of the plate member 51. The lower plate member 52 comprises the peripheral portion A and a depressed portion of a prescribed height for forming the cavity 53, and is provided with a side face C and a main face G52. The thickness of the lower plate member 52 is nearly equal to the thickness of the peripheral portion of the upper plate member 51. The upper plate member 51 and the lower plate member 52 are prepared so that the depth of the above-described enclosing groove portion is larger than the thickness of the peripheral portion A of the upper plate member 51.

The upper plate member 51 and the lower plate member 52 are combined together so as to come into contact with each other at the peripheral portions A, A thereof to form a cavity inside. The peripheral portions A, A of the upper plate member and the lower plate member combined in such a manner are pressure-bonded by the method shown in FIG. 1. As shown in FIG. 11B, the joined portion 54 of the peripheral portions A, A receives a vertical force in the figure and is pressure-bonded to be made thinner in thickness as shown by A', A' and extends horizontally.

The horizontal extend occurs not only in the direction D but also in the direction E. Accordingly, the extends of the peripheral portions in the direction E deform the end portions of the peripheral portions at the cavity side in a direction along the joined interface as shown by F1 and F2.

Since the enclosing groove portion B is provided in the face of the upper plate member 51 forming the cavity, the deformation shown by F1 proceeds toward the inside of the enclosing groove portion B to be absorbed and therefore the main face G51 of the upper plate member 51 is not deformed. Further, the deformation of a corner portion shown by F2 formed by the side face C of the lower plate member 52 and the joined portion 54 is absorbed in cooperation with the above-mentioned enclosing groove portion, and therefore the main face G52 of the lower plate member 52 is not deformed.

Figure 17A:
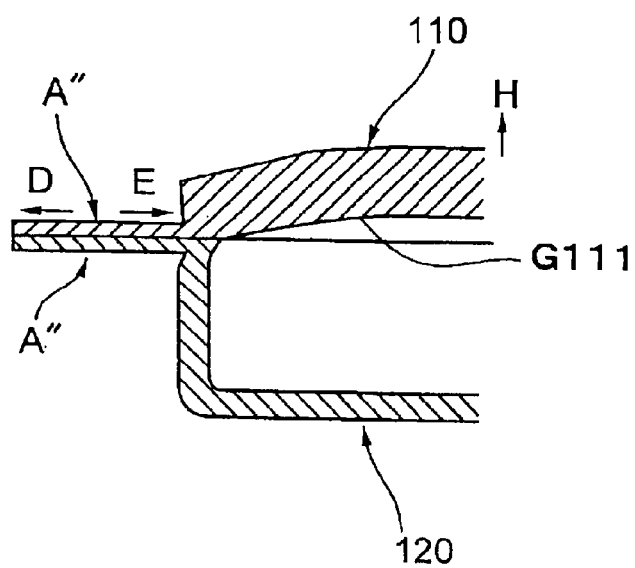
FIG. 17A and FIG. 17B are schematic sectional views showing a state of the plate members where an upper plate member and a lower plate member having no deformation absorbing structure are used and the pressure-bonding is applied to the peripheral portions of the plate members according to the conventional method.
Figure 17B:
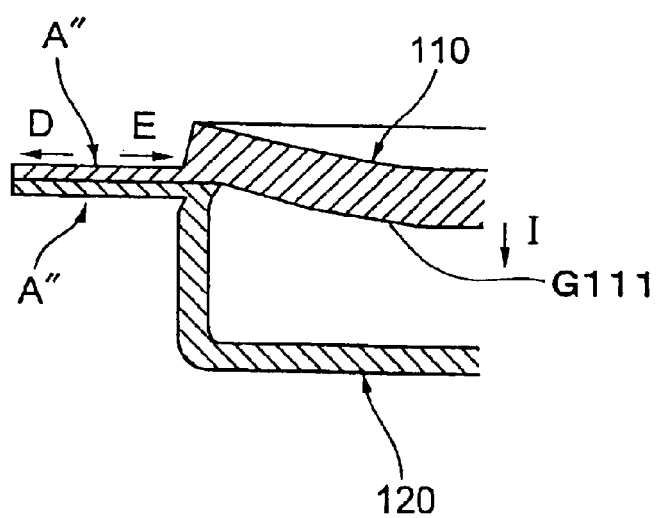

FIG. 17 shows the state of the container using an upper plate member having no enclosing groove portion formed therein and a lower plate member, and applying a pressure-bonding process to the peripheral portions of the plate members. As shown in FIG. 17A, the joined portion of the peripheral portions receives a vertical force in the figure, to be pressure-bonded so as to be made thinner in thickness as shown by A'' and A'', and spreads (i.e., extends) horizontally. The horizontal spread occurs not only in the direction D but also in the direction E. Due to the spread of the peripheral portions in the direction E, a main face G111 of an upper plate member 110 to be intrinsically flat is swollen in the direction H or depressed in the direction I as shown in 17B. It requires much labor to restrict such deformation by means of a mold or reform such deformation after forming a container, and it is difficult to completely restrict or reform it.

The deformation absorbing structure in the above-mentioned embodiment is composed of an enclosing groove portion and a side face of a depressed portion of a prescribed height which forms a cavity.

Figure 12A:
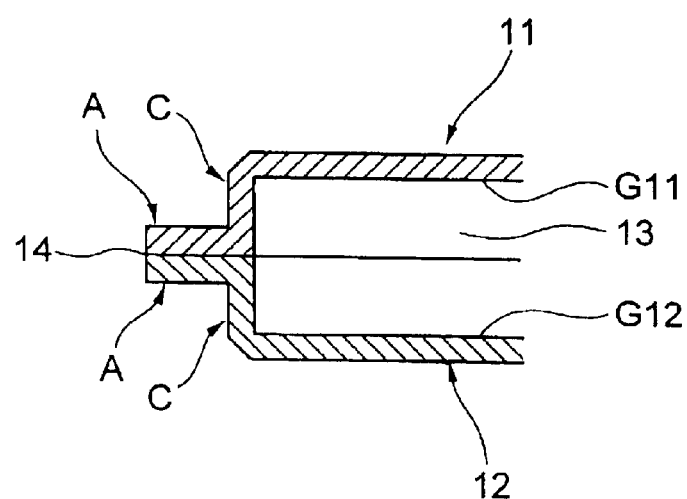
FIG. 12A is a schematic sectional view for explaining the combined plate members before pressure-bonded.

FIG. 12 is a schematic sectional view for explaining another embodiment of a method for manufacturing a plate-type heat pipe of the present invention. FIG. 12A is a schematic sectional view for explaining the state of combining plate members (i.e., placing face to face) before they are pressure-bonded.

Figure 12B:
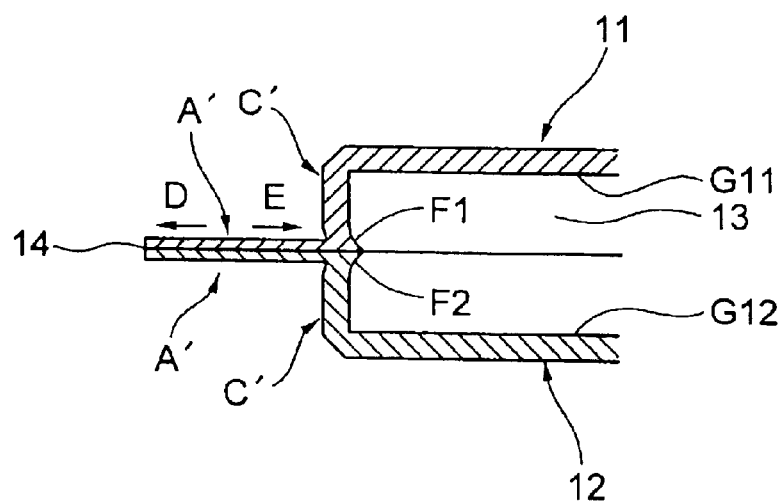
FIG. 12B is a schematic sectional view for explaining the state of the plate members after pressure-bonded.

FIG. 12B is a schematic sectional view for explaining the state of the container after pressure-bonded.

This embodiment of a method for manufacturing a plate-type heat pipe being excellent in hermetical sealing comprises the steps of: preparing a plate member to which at least one heat generating device is thermally connected and another plate member, said plate members forming a cavity inside between them in combination with each other, having the same thickness and each comprising a peripheral portion and a depressed portion of a prescribed height for forming a cavity; providing a deformation absorbing structure for absorbing the deformation of the plate members in a direction along the joined interface between the plate member and the another plate member; combining together the plate member and the another plate member so as to make their depressed portions placed opposite to each other, to pressure-bond the peripheral portions of them so as to absorb the deformation of the plate members in a direction along the joined interface by means of the deformation absorbing structure, thus forming a container provided with a main surface having no deformation; and receiving a working fluid inside the container formed in such a manner.

The above-mentioned deformation absorbing structure comprises the side faces of the depressed portions being placed opposite to each other. Further, the plate member and the another plate member are prepared so that the height of each of the side faces of the depressed portions is made larger than the thickness of each of the plate members.

More specifically, as shown in FIG. 12A, the upper plate member 11 and the lower plate member 12 forming the container of a heat pipe comprise a peripheral portion A and a depressed portion of a prescribed height for forming a cavity 13, respectively, and are press-formed so as to form the cavity 13 by combining the depressed portions of them so as to be placed opposite to each other. The upper plate member 11 and the lower plate member 12 are formed so as to be equal in thickness to each other.

The upper plate member 11 is provided with a peripheral portion A, a side face C and a main face G11. The lower plate member 12 is provided with a peripheral portion A, a side face C and a main face G12. The upper plate member 11 and the lower plate member 12 are prepared so that the height of the above-mentioned side face is made larger than the thickness of each of the plate members 11 and 12.

The upper plate member 11 and the lower plate member 12 are combined together so that they come in contact with each other at their peripheral portions A, A and their depressed portions are placed so as to be opposite to each other. The peripheral portions A, A of the upper plate member and the lower plate member combined in such a manner are pressure-bonded by the method shown in FIG. 1. As shown in FIG. 12B, the joined portion 14 of the peripheral portions A, A receives a vertical force in the figure, is pressure-bonded to be made thinner in thickness as shown by A' and A', and spreads in the horizontal direction. The horizontal spread occurs not only in the direction D but also in the direction E. Accordingly, the spread of the peripheral portions in the direction E deforms the end portions of the peripheral portions at the cavity side in a direction along the joined interface as shown by F1 and F2. The deformation shown by F1 and F2 is absorbed by a fact that a corner portion formed by the side face C of the upper plate member 11 and the joined portion 14, and a corner portion formed by the side face C of the lower plate member 12 and the joined portion 14 proceed along the joined interface, and therefore the main face G11 of the upper plate member 11 and the main face G12 of the lower plate member 12 are not deformed.

More specifically, in this embodiment, the side face C of the upper plate member 11 and the side face C of the lower plate member 12 form a deformation absorbing structure.

As described above, the joined portion of the peripheral portions is pressure-bonded to be made thinner in thickness and spreads in the horizontal direction. However, when the height of the side face is smaller than the thickness of each of the plate members 11 and 12, the end portions of the peripheral portions at the cavity side are not deformed in a direction along the joined interface by the horizontal spread as shown by F1 and F2, but a force is applied directly to and along the main face G11 of the upper plate member 11 or the main face G12 of the lower plate member 12 and thereby the main face G11 or G12 is swollen or depressed along the vertical direction. Therefore, when the height of the side face is smaller than the thickness of each of the plate members 11 and 12, a deformation absorbing structure may not be formed.

Figure 13A:
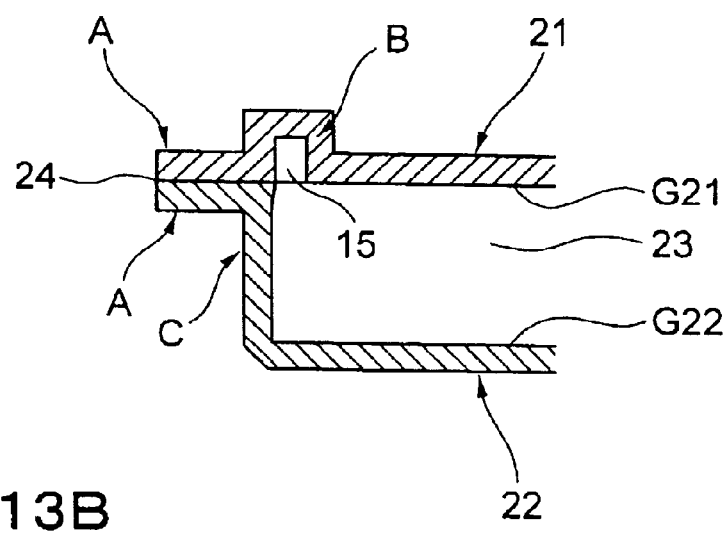
FIG. 13A is a schematic sectional view for explaining the combined plate members before they are pressure-bonded.
Figure 13B:
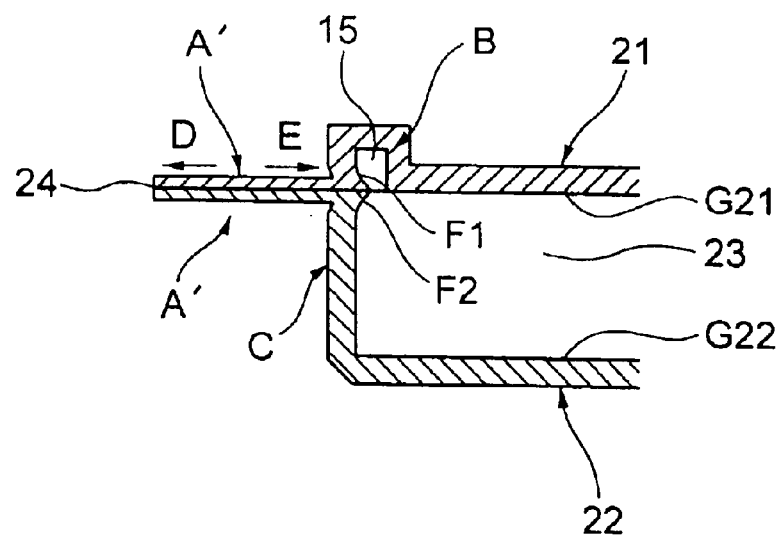
FIG. 13B is a schematic sectional view for explaining the state of the plate members after pressure-bonded.

FIG. 13 is a schematic sectional view for explaining another embodiment of a method for manufacturing a plate-type heat pipe of the present invention. FIG. 13A is a schematic sectional view for explaining the state of combining plate members before they are pressure-bonded. FIG. 13B is a schematic sectional view for explaining the state of the container after pressure-bonded.

In this embodiment, a plate-type heat pipe being excellent in hermetical sealing is manufactured by the steps of: preparing a plate member to which at least one heat generating device is thermally connected and comprising a peripheral portion and a depressed portion of a prescribed height for forming a cavity, and another plate member forming the cavity inside in combination with the plate member, said plate members being the same in thickness as each other; forming the another plate member to have an enclosing reverse U-shaped portion so that a face forming the cavity is depressed so as to form groove and the other face is projected in the shape of a ring in the vicinity of the peripheral portion of the another plate member; combining together the plate member and the another plate member, pressure-bonding the peripheral portions of them, and forming a container provided with a main surface having no deformation, absorbing the deformation of the plate members in a direction along the joined interface by means of a deformation absorbing structure comprising the enclosing reverse U-shaped portion of the another plate member and the side face of the depressed portion of the plate member; and receiving a working fluid inside the container formed in such a manner.

The plate member and the another plate member are prepared so that the depth of the groove of the enclosing reverse U-shaped portion is larger than the thickness of the plate member.

More specifically, an upper plate member 21 and a lower plate member 22 are equal in thickness to each other, and in the upper plate member 21 forming a container of a heat pipe, a main surface G21 is generally flat except the enclosing reverse U-shaped portion B and the enclosing reverse U-shaped portion B is formed by press-forming or the like and projects convexly outwards so as to form the enclosing groove portion 15. The lower plate member 22 is press-formed so as to form the cavity and comprises a peripheral portion and a depressed portion of a prescribed height to form the cavity.

The depressed portion has a side face C and a main face G22. The plate member and the another plate member are prepared so that the depth of the groove of the enclosing reverse U-shaped portion is larger than the thickness of the plate member. The upper plate member 21 and the lower plate member 22 are combined together so that they come into contact with each other at the peripheral portions A, A of them and form a cavity inside. The peripheral portions A, A of the upper plate member and the lower plate member combined in such a manner are pressure-bonded by the method shown in FIG. 1. As shown in FIG. 13B, the joined portion 24 of the peripheral portions A, A receives a vertical force in the figure and is pressure-bonded to be made thinner in thickness and spreads horizontally, as shown by A', A'. The horizontal spread occurs not only in the direction D but also in the direction E. Accordingly, due to the spread of the peripheral portions in the direction E, the end portion of the peripheral portion at the cavity side is deformed as shown by F1 and F2 in a direction along the joined interface.

Since the enclosing groove portion 15 of the enclosing reverse U-shaped portion B is provided on the face of the upper plate member 21 to form the cavity, the deformation shown by F1 proceeds toward the inside of the enclosing groove portion 15 to be absorbed, and therefore the main face G21 of the upper plate member 21 is not deformed. Further, the deformation shown by F2 at a corner portion formed by the side face C of the lower plate member 22 and the joined portion 24 is absorbed in cooperation with the enclosing groove portion 15 described above, and therefore the main face G22 of the lower plate member 22 is not deformed.

According to the heat pipe of this embodiment, the upper plate member and the lower plate member can be prepared using plate materials having the same thickness. In particular, the thickness of the peripheral portion and the main face of the upper plate member is the same, only forming the enclosing reverse U-shaped portion by means of press-forming or the like, thus it is easy to manufacture. A deformation absorbing structure in the embodiment described above comprises an enclosing reverse U-shaped portion B of the upper plate member and a side face C of a depressed portion of a prescribed height of the lower plate member for forming a cavity.

When the depth of the groove of the enclosing reverse U-shaped portion is smaller than the thickness of the plate member, the joined portion of the peripheral portion is pressure-bonded to be made thinner in thickness and the end portion of the peripheral portion at the cavity side is not deformed in the direction E along the joined interface by the horizontal spread of the peripheral portions as shown by F1 and F2, but a force is applied directly to and along the main face G21 of the upper plate member 21 or the main face G22 of the lower plate member 22 to swell or depress the main face G21 or G22 along the vertical directions. Therefore, when the depth of the groove of the enclosing reverse U-shaped portion is smaller than the thickness of each of the plate members 21 and 22, a deformation absorbing structure may not be formed.

Figure 14A:
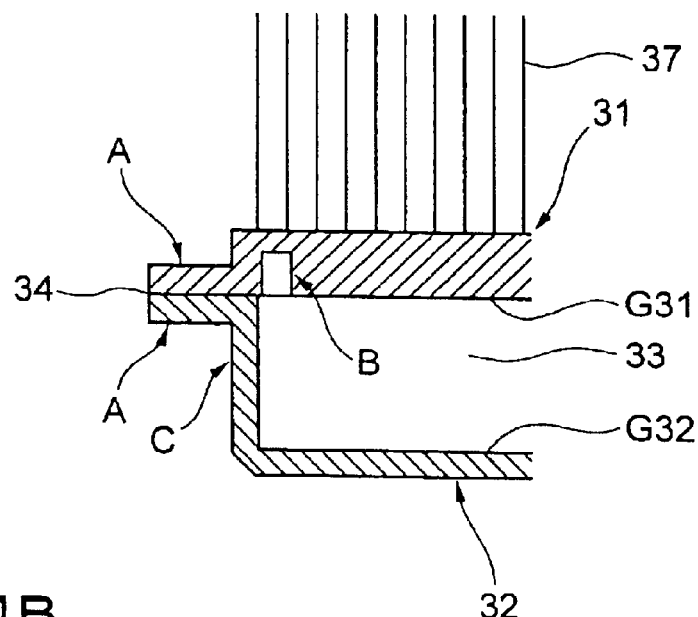
FIG. 14A is a schematic sectional view for explaining the combined plate members before they are pressure-bonded.
Figure 14B:
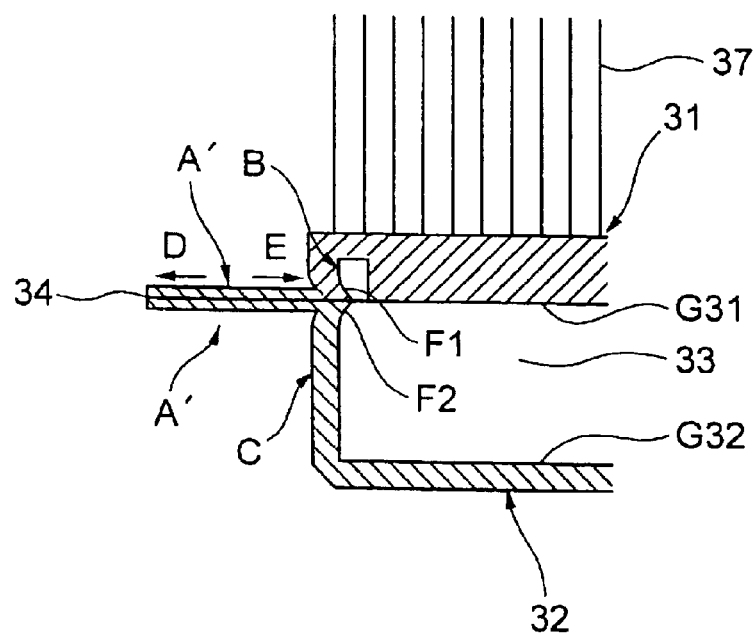
FIG. 14B is a schematic sectional view for explaining the state of the plate members after pressure-bonded.

FIG. 14 is a schematic sectional view for explaining another embodiment of a method for manufacturing a plate-type heat pipe of the present invention. FIG. 14A is a schematic sectional view for explaining the state of combining plate members before they are pressure-bonded. FIG. 14B is a schematic sectional view for explaining the state after pressure-bonded.

In this embodiment, a plate-type heat pipe being excellent in hermetical sealing is manufactured by the steps of: preparing a plate member to which at least one heat generating device is thermally connected and comprising a peripheral portion and a depressed portion of a prescribed height for forming a cavity, and another plate member forming the cavity inside in combination with the plate member, said plate members being different in thickness from each other; providing an enclosing groove portion in a face of the another plate member which is larger than the plate member in thickness to form the cavity and providing a radiating fin on the other face; combining together the plate member and the another plate member, pressure-bonding the peripheral portions of them together, and forming a container provided with a main face having no deformation, absorbing the deformation of the plate members in a direction along the joined interface by means of a deformation absorbing structure comprising the enclosing groove portion of the another plate member and the side face of the depressed portion of the plate member; and receiving a working fluid inside the container formed in such a manner.

More specifically, an upper plate member 31 forming a container of a heat pipe is generally flat and a lower plate member 32 is press-formed so as to form a cavity. An enclosing groove portion B is provided in a face of the upper plate member which is larger than the lower plate member in thickness to form a cavity 33, while a radiating fin 37 is provided on the other face. The thickness of a peripheral portion A is made smaller than the thickness of the main body of the upper plate member 31. The lower plate member 32 has a peripheral portion A and a depressed portion of a prescribed height to form the cavity 33, and is provided with a side face C and a main face G32. The thickness of the lower plate member 32 is generally equal to the thickness of the peripheral portion of the upper plate member 31. The upper plate member 31 and the lower plate member 32 are prepared so that the depth of the enclosing groove portion described above is larger than the thickness of the peripheral portion A of the plate member 31.

The upper plate member 31 and the lower plate member 32 are combined together so that they come into contact with each other at the peripheral portions A, A and form a cavity inside. The peripheral portions A, A of the upper plate member and the lower plate member combined in such a manner are pressure-bonded by the method shown in FIG. 1. As shown in FIG. 14B, the joined portion 34 of the peripheral portions A, A receives a vertical force in the figure, is pressure-bonded to be made thinner in thickness and spreads horizontally as shown by A', A'. The horizontal spread occurs not only in the direction D but also in the direction E. Accordingly, due to the spread of the peripheral portions in the direction E, the end portions of the peripheral portions at the cavity side are deformed in a direction along the joined interface as shown by F1 and F2.

Since the enclosing groove portion B is provided in the face of the upper plate member 31 to form the cavity, the deformation shown by F1 proceeds toward the inside of the enclosing groove portion B to be absorbed, and therefore the main face G31 of the upper plate member 31 is not deformed. Therefore, the radiating fin provided on the upper plate member 31 is not influenced at all. Further, the deformation shown by F2 at a corner portion formed by the side face C of the lower plate member 32 and the lower portion 24 is absorbed in cooperation with the enclosing groove portion described above, and therefore the main face G32 of the lower plate member 32 is not deformed.

A deformation absorbing structure in the embodiment described above comprises an enclosing groove portion of the upper plate member and a side face of a depressed portion of a prescribed height of the lower plate member for forming a cavity.

As described above, the joined portion of the peripheral portions is pressure-bonded to be made thinner in thickness and spreads horizontally. However, when the depth of the enclosing groove portion is smaller the thickness of the peripheral portion A of the plate member 31, the end portion of the peripheral portion at the cavity side is not deformed in the direction E along the joined interface by the horizontal spread as shown by F1 and F2, but a force is applied directly to and along the main face G31 of the upper plate member 31 to swell or depress the main face G31 along the vertical directions. When the main face G31 is swollen or depressed, a radiating fin provided for example by crimping on the outer face of the upper plate member 31 comes off and it is difficult to repair it. Therefore, when the depth of the enclosing groove portion is smaller than the thickness of the peripheral portion A of the plate members 31, a deformation absorbing structure may not be formed.

Figure 15A:
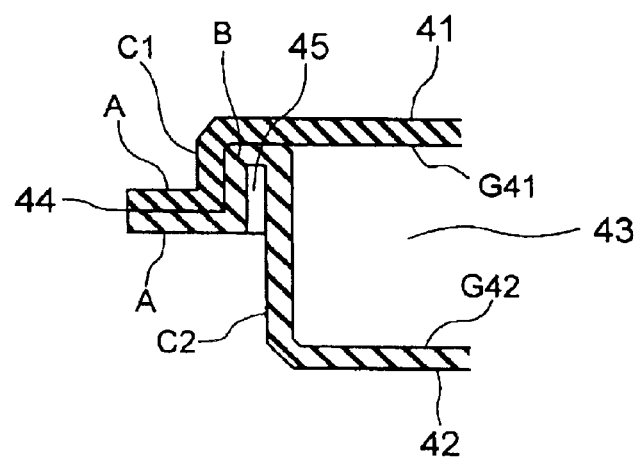
FIG. 15A is a schematic sectional view for explaining the combined plate members before they are pressure-bonded.
Figure 15B:
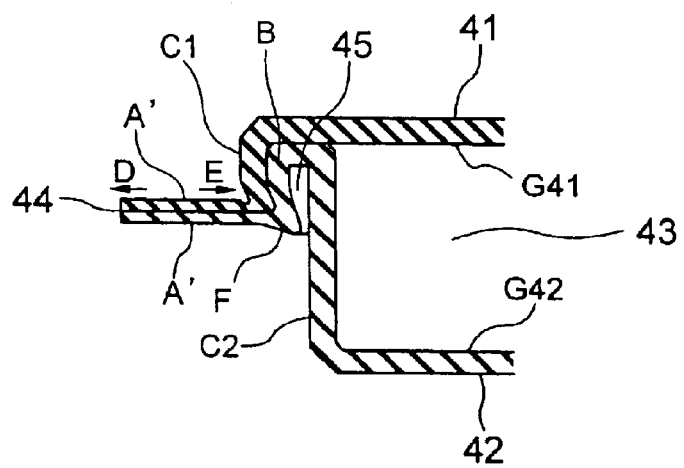
FIG. 15B is a schematic sectional view for explaining the state of the plate members after pressure-bonded.

FIG. 15 is a schematic sectional view for explaining another embodiment of a method for manufacturing a plate-type heat pipe of the present invention. FIG. 15A is a schematic sectional view for explaining the state of combining plate members before they are pressure-bonded. FIG. 15B is a schematic sectional view for explaining the state after pressure-bonded.

In this embodiment, a plate-type heat pipe being excellent in hermetical sealing is manufactured by the steps of:

preparing a plate member to which at least one heat generating device is thermally connected and another plate member forming a cavity inside thereof in combination with said plate member, where an enclosing reverse U-shaped portion is provided in a portion of said plate member in which said cavity is formed, a side face portion of a prescribed height corresponding to said enclosing reverse U-shaped portion is provided on said another plate member;

providing in said plate member and said another plate member a deformation absorbing structure for absorbing a deformation in a direction along a joined interface between said plate member and said another plate member, comprising said enclosing reverse U-shaped portion of said plate member and said side face portion of said another plate member;

combining together said plate member and said another plate member, and pressure-bonding peripheral portions thereof and absorbing a deformation in a direction along said joined interface by means of said deformation absorbing structure, to thereby form a container having no deformation on a main face; and receiving a working fluid inside thus formed container to manufacture a hermetically sealed plate-type heat pipe.

The plate member and the another plate member are prepared so that the depth of the groove of the enclosing reverse U-shaped portion described above is larger than the thickness of the plate member.

More specifically, an upper plate member 41 and a lower plate member 42 are equal in thickness to each other, and in the upper plate member 41 to form a container of a heat pipe, a main face G41 is flat except a side face C1 and a peripheral portion A, and the side face C1 and the peripheral portion A are formed by press-forming or the like. The lower plate member 42 is press-formed so as to form a cavity, comprises a peripheral portion and a depressed portion of a prescribed height for forming a cavity, and further comprises an enclosing reverse U-shaped portion B between the peripheral portion and the depressed portion. The peripheral portion A, the enclosing reverse U-shaped portion B and the side face C2 are formed by press-forming or the like. The plate member and the another plate member are prepared so that the depth of the groove of the enclosing reverse U-shaped portion is larger than the thickness of the plate member.

The upper plate member 41 and the lower plate member 42 are combined together so that they come into contact with each other at the peripheral portions A, A and form a cavity inside. The peripheral portions A, A of the upper plate member and the lower plate member combined in such a manner are pressure-bonded by the method shown in FIG. 1. As shown in FIG. 15A, the joined portion 44 of the peripheral portions A, A receives a vertical force in the figure and is pressure-bonded to be made thinner in thickness and spreads horizontally as shown by A', A'. The horizontal spread occurs not only in the direction D but also in the direction E. Accordingly, due to the spread of the peripheral portions in the direction E, the end portion of the peripheral portion at the cavity side is deformed in a direction along the joined interface as shown by F.

Since the enclosing groove portion 45 of the enclosing reverse U-shaped portion B is provided outside the side face of the lower plate member 42 to form a cavity, the deformation shown by F proceeds toward the inside of the enclosing groove portion 45 to be absorbed, and therefore the main face G41 of the upper plate member 41 and the main face G42 of the lower plate member 42 are not deformed.

According to the heat pipe of this embodiment, the upper plate member and the lower plate member can be prepared using plate materials having the same thickness. In particular, the thickness of the peripheral portion and the main face of the upper plate member is the same, only forming the enclosing reverse U-shaped portion and the side face portion by means of press-forming or the like, thus it is easy to manufacture. A deformation absorbing structure in the embodiment described above comprises an enclosing reverse U-shaped portion B and a side face C1 of a depressed portion of a prescribed height for forming a cavity. Further, since no swelling is generated in the main faces G41 and G42, there is also an advantage that the degree of freedom of design of a joined portion with a cooled member or a radiating fin is great.

When the depth of the groove of the enclosing reverse U-shaped portion is smaller than the thickness of the plate member, the joined portion of the peripheral portion is pressure-bonded to be made thinner in thickness and the end portion of the peripheral portion at the cavity side is not deformed in the direction E along the joined interface by the horizontal spread of width as shown by F, but a force is applied directly to and along the main face G41 of the upper plate member 41 or the main face G42 of the lower plate member 42 to swell or depress the main face G41 or G42 along the vertical directions. Therefore, when the depth of the enclosing reverse U-shaped portion is smaller than the thickness of each of the plate members 41 and 42, a deformation absorbing structure is not formed.

Figure 16A:
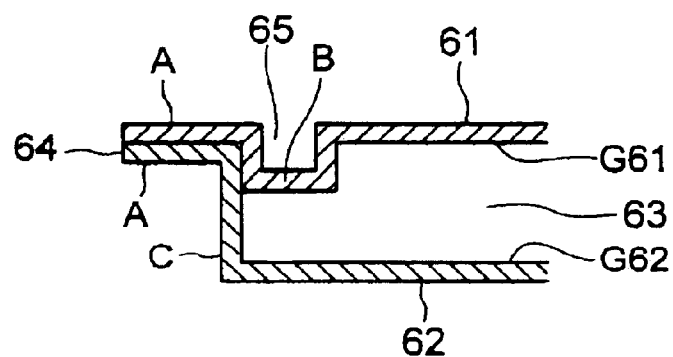
FIG. 16A is a schematic sectional view for explaining the combined plate members before they are pressure-bonded.

FIG. 16 is a schematic sectional view for explaining another embodiment of a method for manufacturing a plate-type heat pipe of the present invention. FIG. 16A is a schematic sectional view for explaining the state of combining plate members before they are pressure-bonded. FIG. 1B is a schematic sectional view for explaining the state of the container after pressure-bonded.

In this embodiment, a plate-type heat pipe being excellent in hermetical sealing is manufactured by the steps of: preparing a plate member to which at least one heat generating device is thermally connected and comprising a peripheral portion and a depressed portion of a prescribed height for forming a cavity, and another plate member forming the cavity inside in combination with the plate member, said plate members being the same in thickness as each other; forming the another plate member to have an enclosing U-shaped portion so that a face forming the cavity is projected into the cavity and the other face is depressed in the shape of an enclosing groove in the vicinity of the peripheral portion of the another plate member; combining together the plate member and the another plate member, pressure-bonding the peripheral portions of them, and forming a container provided with a main surface having no deformation, absorbing the deformation of the plate members in a direction along the joined interface by means of a deformation absorbing structure comprising the enclosing U-shaped portion of the another plate member and the upper end portion of the side face of the depressed portion of the plate member; and receiving a working fluid inside the container formed in such a manner.

The plate member and the another plate member are prepared so that the depth of the groove of the enclosing U-shaped portion is larger than the thickness of the plate member.

More specifically, an upper plate member 61 and a lower plate member 62 are equal in thickness to each other, and in the upper plate member 61 forming a container of a heat pipe, a main surface G61 is generally flat except the enclosing U-shaped portion B and the enclosing U-shaped portion B is formed by press-forming or the like and projects convexly inwards the cavity so as to form the enclosing groove portion 65. The lower plate member 62 is press-formed so as to form the cavity and comprises a peripheral portion and a depressed portion of a prescribed height to form the cavity.

Figure 16B:
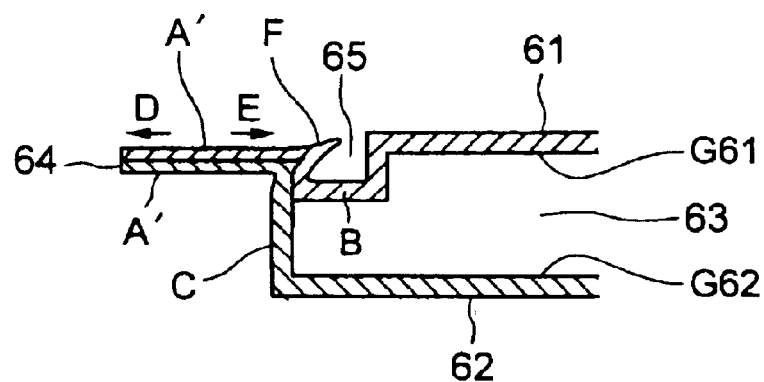
FIG. 16B is a schematic sectional view for explaining the state of the plate members after pressure-bonded.

The depressed portion has a side face C and a main face G62. The plate member and the another plate member are prepared so that the depth of the groove of the enclosing U-shaped portion is larger than the thickness of the plate member. The upper plate member 61 and the lower plate member 62 are combined together so that they come into contact with each other at the peripheral portions A, A of them and form a cavity inside. The peripheral portions A, A of the upper plate member and the lower plate member combined in such a manner are pressure-bonded by the method shown in FIG. 1. As shown in FIG. 16B, the joined portion 64 of the peripheral portions A, A receives a vertical force in the figure and is pressure-bonded to be made thinner in thickness and spreads horizontally, as shown by A', A'. The horizontal spread occurs not only in the direction D but also in the direction E. Accordingly, due to the spread of the peripheral portions in the direction E, the end portion of the peripheral portion at the cavity side is deformed as shown by F in a direction along the joined interface.

Since the enclosing groove portion 65 of the enclosing U-shaped portion B is provided on the upper side of the upper plate member 61, the deformation shown by F proceeds toward the inside of the enclosing groove portion 65 to be absorbed, and therefore the main face G61 of the upper plate member 61 and the main face G62 of the lower plate member 62 are not deformed.

According to the heat pipe of this embodiment, the upper plate member and the lower plate member can be prepared using plate materials having the same thickness. In particular, the thickness of the peripheral portion and the main face of the upper plate member is the same, only forming the enclosing U-shaped portion by means of press-forming or the like, thus it is easy to manufacture. A deformation absorbing structure in the embodiment described above comprises an enclosing U-shaped portion B of the upper plate member and the upper end portion of the side face C of a depressed portion of a prescribed height of the lower plate member for forming a cavity.

When the depth of the groove of the enclosing U-shaped portion is smaller than the thickness of the plate member, the joined portion of the peripheral portion is pressure-bonded to be made thinner in thickness and the end portion of the peripheral portion at the cavity side is not deformed in the direction E along the joined interface by the horizontal spread of the peripheral portions as shown by F, but a force is applied directly to and along the main face G61 of the upper plate member 61 or the main face G62 of the lower plate member 62 to swell or depress the main face G61 or G62 along the vertical directions. Therefore, when the depth of the groove of the enclosing U-shaped portion is smaller than the thickness of each of the plate members 61 and 62, a deformation absorbing structure may not be formed.

In the plate-type heat pipe of the above embodiment, as shown in FIG. 16B, since the deformation absorbing structure absorbs the deformation due to the spread of the peripheral portions in the direction E, the end portion forming enclosing U-shaped portion 65 is deformed inward in the groove, thus there is no externally protruding portion in the upper side of the container. Accordingly, a heat sink extending over the deformation absorbing structure, for example, may be installed on the upper plate member, thus a design choice of the heat sink may be further extended.

A plate-type heat pipe of the present invention is a plate-type heat pipe manufactured by a manufacturing method described above.

More specifically, an embodiment of a plate-type heat pipe of the present invention is a plate-type heat pipe being excellent in hermetical sealing and having a container both main surfaces of which are high in flatness, said plate-type heat pipe being manufactured by the steps of;

preparing a plate member to which at least one heat generating device is thermally connected and another plate member to form a cavity inside in combination with the plate member;

providing a deformation absorbing structure for absorbing the deformation of the plate members in a direction along the joined interface between the plate member and the another plate member on at least one of the plate member and the another plate member;

combining together the plate member and the another plate member, pressure-bonding the peripheral portions of them to each other, and forming a container provided with a main face having no deformation, absorbing the deformation of the plate members in a direction along the joined interface by means of the deformation absorbing structure, and receiving a working fluid inside the container formed in such a manner. This is a plate-type heat pipe in which the plate member and the another plate member described above are different in thickness from each other.

Further, another embodiment of a plate-type heat pipe of the present invention is a plate-type heat pipe in which a fin is fixed on another plate member by inserting an end of the fin into a dent in which the fin can be inserted, for example, a groove or a hole and thereafter press-deforming and crimping the vicinity of said dent by means of a jig.

In case that a fin is fixed to another plate member by crimping in such a manner, the deformation absorbing structure can solve a problem that when the another plate member is deformed, the crimped fin comes off or the thermal resistance of the fin becomes higher so as to lower the heat dissipating performance due to a gap made between the another plate member and the fin.

Another embodiment of a plate-type heat pipe of the present invention is a plate-type heat pipe being excellent in hermetical sealing and having a container both main surfaces of which are high in flatness, said plate-type heat pipe being manufactured by the steps of:

preparing a plate member to which at least one heat generating device is thermally connected and another plate member, said plate members having the same thickness, each comprising a peripheral portion and a depressed portion of a prescribed height for forming a cavity;

providing a deformation absorbing structure for absorbing the deformation of the plate members in a direction along the joined interface between the plate member and the another plate member;

combining together the plate member and the another plate member so that the depressed portions of them are placed opposite to each other, pressure-bonding the peripheral portions of them and forming a container provided with a main face having no deformation, absorbing the deformation of the plate members in a direction along the joined interface by means of the deformation absorbing structure, and receiving a working fluid inside the container formed in such a manner.

A plate-type heat pipe of this invention may comprises a container being in the shape described above, and has a wick arranged inside its cavity. Additionally, a heat transfer block may be arranged within the container.

Although not illustrated, a plate-type heat pipe can be made by providing an opening (i.e., port) for injection of liquid and degassing in some area of a container and injecting a working fluid (pure water) into and degassing from the container.

Further, brazing or soldering may be additionally applied to the pressure-bonded peripheral portion. By brazing or soldering the joined portion of the pressure-bonded peripheral portions, the mechanical strength is reinforced and/or the corrosion of the joined interface may be prevented.

More specifically, in a plate-type heat pipe of the present invention, since its peripheral portions are hermetically sealed by pressure-bonding, in case of reinforcing the pressure-bonded portion of the peripheral portion by brazing or soldering from the outside, no braze nor solder enters inside the heat pipe and comes into contact with a working fluid. As a brazing or soldering method, there can be used a vacuum furnace, an atmospheric furnace, a torch, a soldering iron or the like. These methods are appropriately selected according to the material, shape and size of a container of a heat pipe, the heat performance required for a heat pipe, the interaction thereof with a working fluid or the like.

Further, an additional welding may be applied to the pressure-bonded peripheral portions. In case that a sufficient mechanical strength of pressure resistance or the like is obtained by pressure-bonding but the state of hermetic sealing is not complete and there is the possibility of slight leakage, welding may be additionally used. In this case also, the pressure-bonding bears a great portion of joining strength. As a welding method, there can be used methods of a TRIG welding, a plasma welding, a laser welding, an electron beam welding or the like. These welding methods are properly selected according to the material, shape and size of a container of a heat pipe, the heat performance required for a heat pipe, the interaction of them with a working fluid or the like.

Furthermore, a convex portion for efficiently cooling a heat generating device is formed in one plate member to which the heat generating device is thermally connected.

The shape of the convex portion may be determined according to the arrangement or the like of a heat generating device and other components to be mounted on a printed circuit board.

Usually a container is formed out of a material of only one kind such as only copper or only aluminum, but the embodiment may uses clad materials for plate members. In case of using clad materials, it is possible to use a material being high in adaptivity to a working fluid, for example, copper as a material for forming the inner layer of a container of the clad materials and use a material of high strength, low cost, light weight or the like, for example, aluminum according to requirements for mechanical strength and appearance as a material for forming the outer layer, thus it is possible to extend freedom of mechanical design choice and reduce the cost.

Moreover, in a plate-type heat pipe of the present invention, a printed circuit board mounted with a heat generating device is joined to a main face of a plate-type heat pipe described above and a heat sink is joined to the other main surface and further a fan for blowing the heat sink is provided at a prescribed position, and thus the mounting is performed.

The present invention is described further in detail by means of embodiments.

EXAMPLES

Example 1

As shown in FIG. 2, a lower plate member 2 which is press-formed so as to have a depressed bottom portion and a flat upper plate member 1 were prepared. Each of the plate members is made of a pure copper plate of 1 mm in thickness. Then, the peripheral portions 4 of the upper plate member 1 and the lower plate member 2 were combined together, in which a heat transfer block 6 made of pure copper and a wick 5 made of pure copper were arranged. The wick 5 had an opening 13 for housing the heat transfer block. Before they were combined, the surfaces to be joined of the peripheral portions of the upper plate member 1 and the lower plate member 2 had been cleaned by brushing to remove membranes or extraneous matter of an oxide, hydroxide, organic matter or the like.

The upper plate member 1 and the lower plate member 2 were combined together as keeping the surfaces to be joined of the peripheral portions clean, and the peripheral portions were pressure-bonded at the normal room temperature in the air. The amount of displacement by pressing at that time was 70%. More specifically, the pressure-bonding was performed by squashing only the peripheral portions, using a mold for pressing only the peripheral portions without pressing the hollow portion of a container. By pressure-bonding the peripheral portions in such a way, the container having a heat transfer block and a wick arranged therein, and being 70 mm×90 mm×7 mm in total size and excellent in hermetical sealing was manufactured. Then, a plate-type heat pipe was manufactured by providing a port for liquid injection and degassing in some area of the container and injecting a working fluid (pure water) into and degassing the container.

When testing the joined portions which are pressure-bonded of thus manufactured plate-type heat pipe were made for investigating strength and hermetical sealing, it was found that the strength of the joined portions was so firm that the joined portions were not stripped off at a pressure of 140 kPa in a pressurizing test, and the hermetical sealing was $1\times10^{-9}$ Pa m$^3$/s or less in leakage amount in an He leak test.

Example 2

As shown in FIG. 10, a lower plate member 12 which is press-formed so as to have a depressed bottom portion and a flat upper plate member 11 were prepared. Each of the plate members is made of a clad plate of 1.0 mm in thickness composed of a pure copper layer of 0.2 mm in thickness and an aluminum layer of 0.8 mm in thickness. Then, the peripheral portions 4 of the upper plate member 11 and the lower plate member 12 were combined together so that the respective inner faces of the container became the pure copper layer, and a heat transfer block 6 made of pure copper and a wick 5 made of pure copper were arranged in the container. The wick had an opening 13 for housing the heat transfer block, as shown in FIG. 2. Before they were combined, the surfaces to be joined of the peripheral portions of the upper plate member 11 and the lower plate member 12 had been cleaned by brushing to remove membranes or extraneous matter of an oxide, hydroxide, organic matter or the like.

The upper plate member 11 and the lower plate member 12 were combined together as keeping the surfaces to be joined of the peripheral portions clean, and the peripheral portions were pressure-bonded at the normal room temperature in a vacuum. The amount of displacement by pressing at that time was 50%.

More specifically, the pressure-bonding was performed by squashing only the peripheral portions, using a mold for pressing only the peripheral portions without pressing the hollow portion of the container. By pressure-bonding the peripheral portions in such a way, the container having a heat transfer block and a wick arranged therein, being 70 mm×90 mm×7 mm in total size, having the outer face made of aluminum and being excellent in hermetical sealing was manufactured. Then, a plate-type heat pipe was manufactured by providing a port for liquid injection and degassing in some area of the container and injecting a working fluid (pure water) into and degassing the container.

When testing the joined portions which are pressure-bonded of thus manufactured plate-type heat pipe were made for investigating strength and hermetical sealing, it was found that the strength of the joined portions was so firm that the joined portions were not stripped off at a pressure of 140 kPa in a pressurizing test, and the hermetical sealing was $1\times10^{-9}$ Pa m$^3$/s or less in leakage amount in an He leak test.

As described above, a plate-type heat pipe of the invention maintains the strength of the plate material for forming a container at a prescribed level, and has a high strength of the joined portions as well as a high hermetical sealing.

Example 3

As shown in FIG. 11, a flat upper plate member 1 of 80 mm×60 mm having a main face portion of 2.6 mm in thickness and a peripheral portion of 1 mm in thickness, and a lower plate member 2 of 1 mm in thickness being press-formed in the shape of a box each were made of a pure copper plate. An enclosing groove portion B of 0.8 mm in width and 1.2 mm in depth was provided in the vicinity of the joined portion of a face of the upper plate member to form a cavity. Then, the peripheral portions 4 of the upper plate member 1 and the lower plate member 2 were combined together, and a wick made of pure copper were arranged inside. Before they were combined, the surfaces to be joined of the peripheral portions of the upper plate member 1 and the lower plate member 2 had been cleaned by brushing to remove membranes or extraneous matter of an oxide, hydroxide, organic matter or the like.

The upper plate member 1 and the lower plate member 2 were combined together as keeping the surfaces to be joined of the peripheral portions clean, and the peripheral portions were pressure-bonded at the normal room temperature in the air. The amount of displacement by pressing at that time was 70%. As shown in FIG. 11B, the peripheral portion A was made thinner in thickness and spread horizontally. The spread of the peripheral portions in the direction E moved slightly the boundary portion between the peripheral portion and the main face portion, and the boundary portion between the peripheral portion and the side face portion toward the cavity side to deform. At that time, deformation such as swelling, depression or the like was not found in any of the main faces of the upper plate member 1 and the lower plate member 2. More specifically, since the enclosing groove portion provided in the upper plate member and the side face of the lower plate member functioned as a deformation absorbing structure and could absorb the deformation of the plate members in a direction along the joined interface, a container with a main face having no deformation could be manufactured. Thus, the container having a wick arranged inside thereof by pressure-bonding the peripheral portions in such a manner, being 80 mm×60 mm×7 mm in total size, and being excellent in hermetical sealing was manufactured. Then, a plate-type heat pipe was manufactured by providing a port for liquid injection and degassing in some area of the container and by injecting a working fluid (pure water) into and degassing the container.

When testing the joined portions which are pressure-bonded of the plate-type heat pipe was made for investigating strength and hermetical sealing, it was found that the strength of the joined portions was so firm that the joined portions were not stripped off at a pressure of 140 kPa in a pressurizing test and the hermetical sealing was $1\times10^{-9}$ Pa m$^3$/s or less in leakage amount in an He leak test. Furthermore, the main face portions were not deformed and were excellent in flatness.

According to the present invention, it is possible to provide a plate-type heat pipe including a container having no deformation in the main faces thereof and having high strength in the joined portions as well as high hermetical sealing, and is excellent in long-term reliability. Furthermore, according to the present invention, it is possible to manufacture a plate-type heat pipe for cooling a device to be cooled having a high heat generating device such as a semiconductor device or the like, in which the number of components forming the heat pipe is reduced, simplifying the manufacturing process, lowering cost and improving high reliability.

What is claimed is:

1. A method for manufacturing a plate-type heat pipe, which comprises the steps of:

preparing a plate member to which at least one heat generating device is thermally connected and another plate member forming a cavity inside thereof in combination with said plate member;

forming in at least one plate member of said plate member and said another plate member a deformation absorbing structure for absorbing a deformation in a direction along a joined interface between said plate member and said another plate member;

combining together said plate member and said another plate member, and pressure-bonding peripheral portions thereof and absorbing a deformation in a direction along said joined interface by means of said deformation absorbing structure, to thereby form a container having no deformation on a main face; and receiving a working fluid inside thus formed container to manufacture a hermetically sealed plate-type heat pipe.

2. A method for manufacturing a plate-type heat pipe according to claim 1, wherein an enclosing groove portion is formed in a portion of said another plate member in which said cavity is formed, and said deformation absorbing structure comprises said enclosing groove portion.

3. A method for manufacturing a plate-type heat pipe according to claim 2, wherein said plate member having said peripheral portion and a depressed portion of a prescribed height which forms said cavity is prepared, and said deformation absorbing structure comprises said enclosing groove portion and side face of said depressed portion.

4. A method for manufacturing a plate-type heat pipe according to claim 2 or 3, wherein said plate member and said another plate member are prepared so that a depth of said enclosing groove portion is larger than a thickness of said peripheral portion.

5. A method for manufacturing a plate-type heat pipe according to claim 1, wherein said plate member and said another plate member comprises a clad plate material, respectively.

6. A method for manufacturing a plate-type heat pipe according to claim 1, wherein said cavity is formed by deep-drawing, bulging or forging in at least one of said plate member and said another plate member.

7. A method for manufacturing a plate-type heat pipe according to claim 6, wherein a convex portion is formed in a portion to which said at least one heat generating device is thermally connected.

* * * * *